Figure 1:
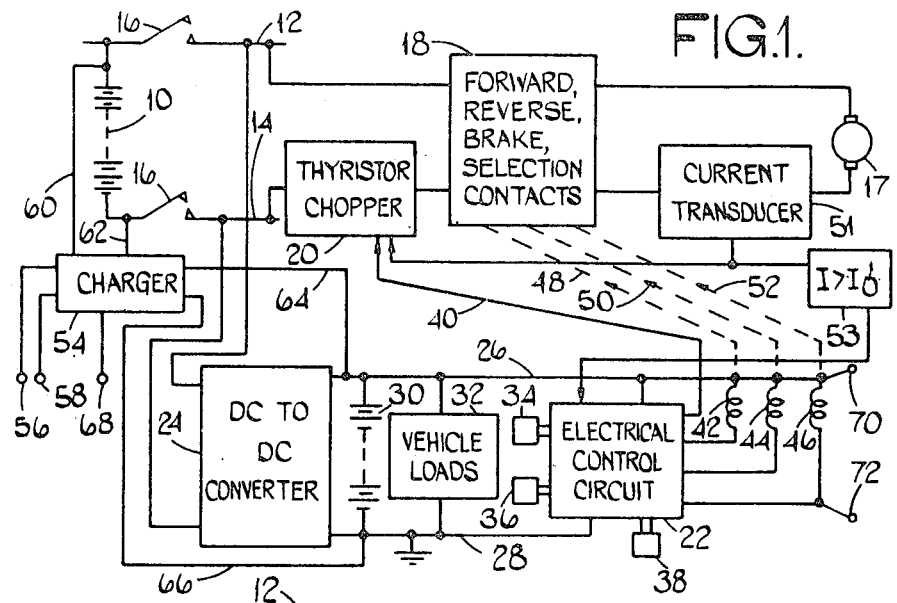

United States Patent [19]

Lowndes

[11] 4,325,010
[45] Apr. 13, 1982

[54] BATTERY STATE OF CHARGE INDICATOR DEVICE

[75] Inventor: Michael W. Lowndes, Birmingham, England

[73] Assignee: Lucas Industries Limited, Birmingham, England

[21] Appl. No.: 171,937

[22] Filed: Jul. 18, 1980

Related U.S. Application Data

[60] Division of Ser. No. 146,900, May 5, 1980, which is a continuation of Ser. No. 918,539, Jun. 23, 1978, abandoned.

[30] Foreign Application Priority Data

Jul. 1, 1977 [GB] United Kingdom ............... 27716/77
Apr. 12, 1978 [GB] United Kingdom ............... 14288/78

[51] Int. Cl.³ .............................................. H02P 5/28
[52] U.S. Cl. ..................................... 318/139; 320/45

[58] Field of Search ................... 318/139; 320/43, 45, 320/48; 324/426, 427, 429, 435, 436; 340/636, 660, 661; 180/65

[56] References Cited

U.S. PATENT DOCUMENTS 3,890,556  6/1975  Melling et al. ........................ 320/43
4,165,795  8/1979  Lynch et al. ..................... 180/65 R

*Primary Examiner*—Gene Z. Rubinson
*Attorney, Agent, or Firm*—Ladas & Parry

[57] ABSTRACT

A battery state of charge indicating device intended for use in a battery powered vehicle includes a battery voltage measuring circuit which produces an output signal dependent on the voltage of a storage battery. A switch element connects the output signal to a storage capacitor when conductive. Switch element is rendered conductive from time to time by a timer circuit triggered by an input from a motor current detector circuit. The timer circuit is triggered whenever the motor current falls below a threshold value, indicating that the battery current has ceased.

5 Claims, 7 Drawing Figures

BATTERY STATE OF CHARGE INDICATOR DEVICE

This is a division of application Ser. No. 146,900, filed May 5, 1980, which is a continuation of Ser. No. 918,539, filed June 23, 1978, now abandoned.

This invention relates to a battery state of charge indicator device, intended for use, for example in a battery powered road vehicle to enable the driver to monitor the remaining charge in the battery accurately.

Although various forms of battery charge indicators have been proposed in the past these have all had disadvantages which render them unsuitable for accurate monitoring, such disadvantages tending to arise because of the manner in which the battery voltage tends to fluctuate according to the current being drawn from or returned to the battery at any given instant.

Broadly speaking the present invention resides in a battery state of charge indicator installation comprising a pair of terminals connected to the opposite poles of a battery to be monitored, means sensitive to a specific battery current condition, means for measuring the voltage across said terminals and indicating means operable by said measuring means, the measuring means being controlled by said means sensitive to a specific battery current condition, so that the measuring means only operates the indicating means when said specific battery current condition exists.

The specific battery current condition concerned may be the cessation of flow of battery current to a load, for example, a vehicle traction motor. Specifically, the means sensitive to a specific battery current condition may comprise timer means which produces a measuring means enabling output for a first predetermined time period, delayed by a second predetermined time period from the cessation of current from the battery to the motor.

When the battery state of charge indicator installation forms a part of a battery vehicle motor control system various pre-existing parts of the control system may be used to act as the means sensitive to a specific battery condition. For example it has heretofore been proposed to utilize various relay or contactor circuits to control the mode of connection of the motor to the battery, with a current interlock arrangement provided to prevent opening of a contactor which is carrying motor current until such current has fallen to a predetermined level, when a specific contactor has been closed for a time and is then allowed to open, this opening indicates that a specific battery current condition exists at the instant of opening. Thus the disappearance of a drive voltage across the contactor winding indicates that this condition exists at the instant of such disappearance.

Alternatively, instead of relying on the contactor operating circuits, the cessation of battery current may be separately detected in which case the circuit may include a delay circuit which produces an output after a predetermined delay commencing with the detection of cessation of current.

Preferably the indicating means includes a storage device, which can store the output of the measuring means between successive sampling instants. The indicating means may include a motor continuously indicating the magnitude of the signal stored on said storage device.

Conveniently the connection of said measuring means to said storage means includes a unidirectional current flow device such that the signal stored thereon cannot be increased by successive sampling operations. This provision ensures that a falsely high indication is not obtained when sampling occurs following a period of very low current consumption.

When such unidirectional current flow device is incorporated means may be provided for introducing an initial signal on to said storage device which is representative of the battery voltage at switch-on.

The invention also resides in a battery state of charge indicating device comprising the combination of a pair of terminals for connection to opposite poles of a battery to be monitored, a voltage measuring circuit connected to provide an output dependent on the voltage across said terminals, a storage device, means connecting the storage device to the voltage measuring circuit and including a switch element and means having a control terminal and including a timer circuit for rendering said switch element conductive for a period when an appropriate input signal is applied to said control terminal.

Preferably said connecting means includes a unidirectional current flow device arranged so that the signal stored on said storage device cannot normally be increased when said switch element is conductive.

Figure 2:
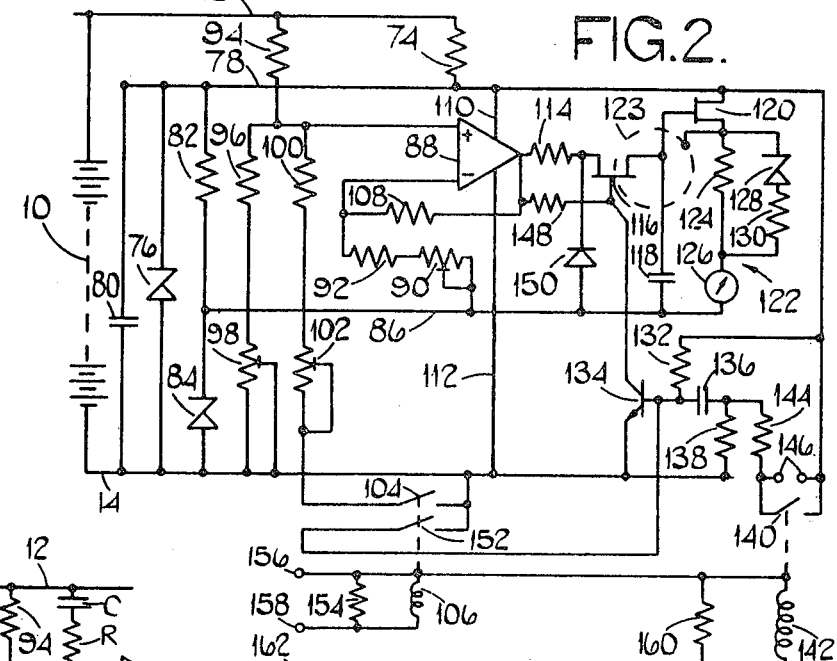
Figure 2A:
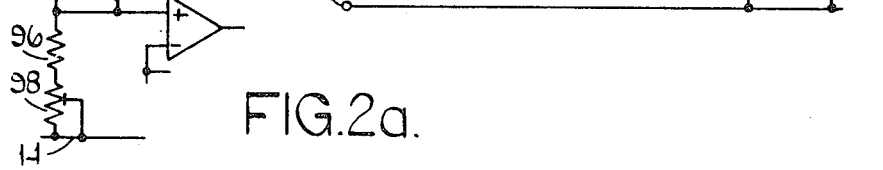
Figure 3:
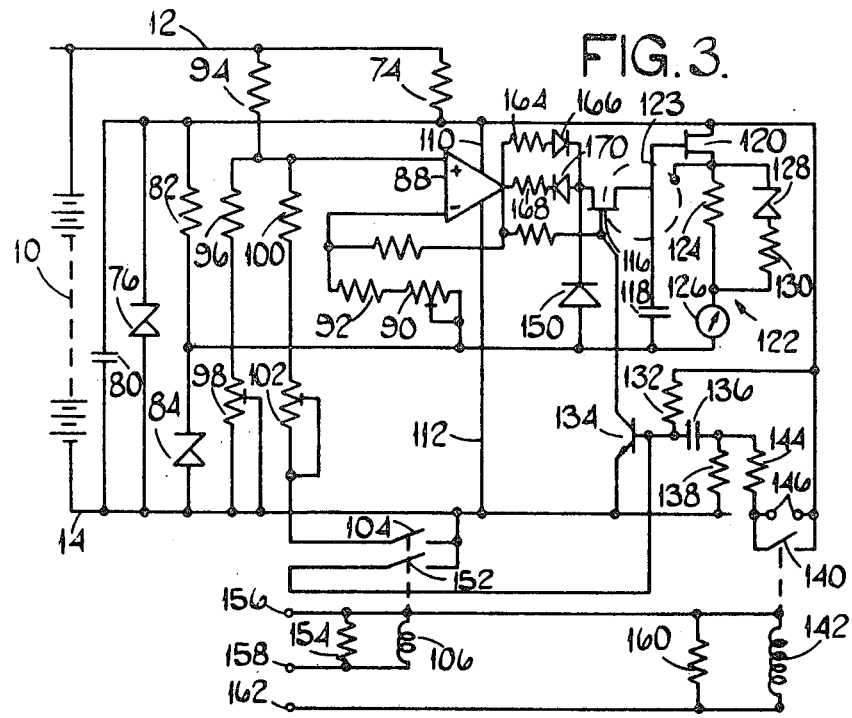
Figure 4:
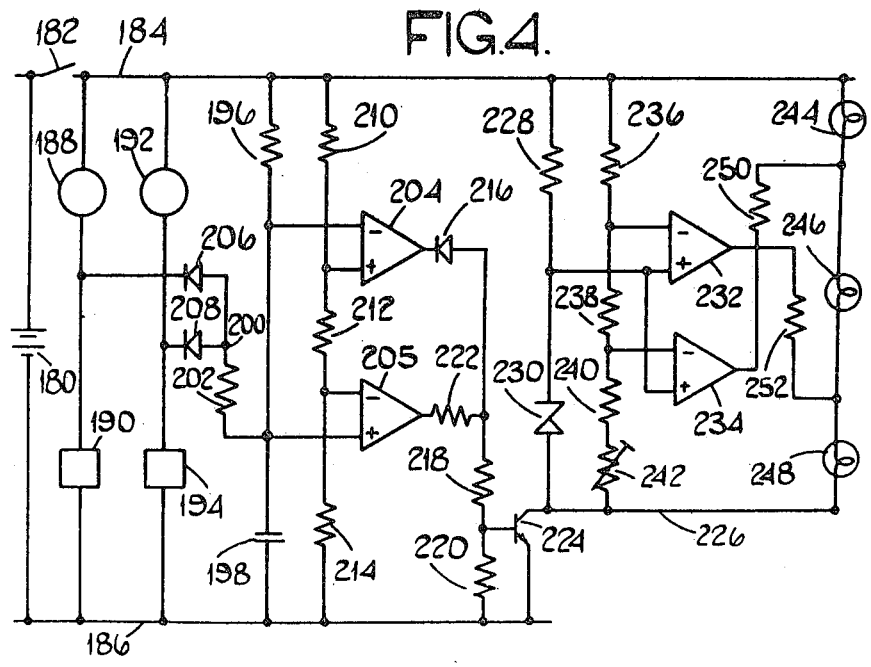
Figure 5:
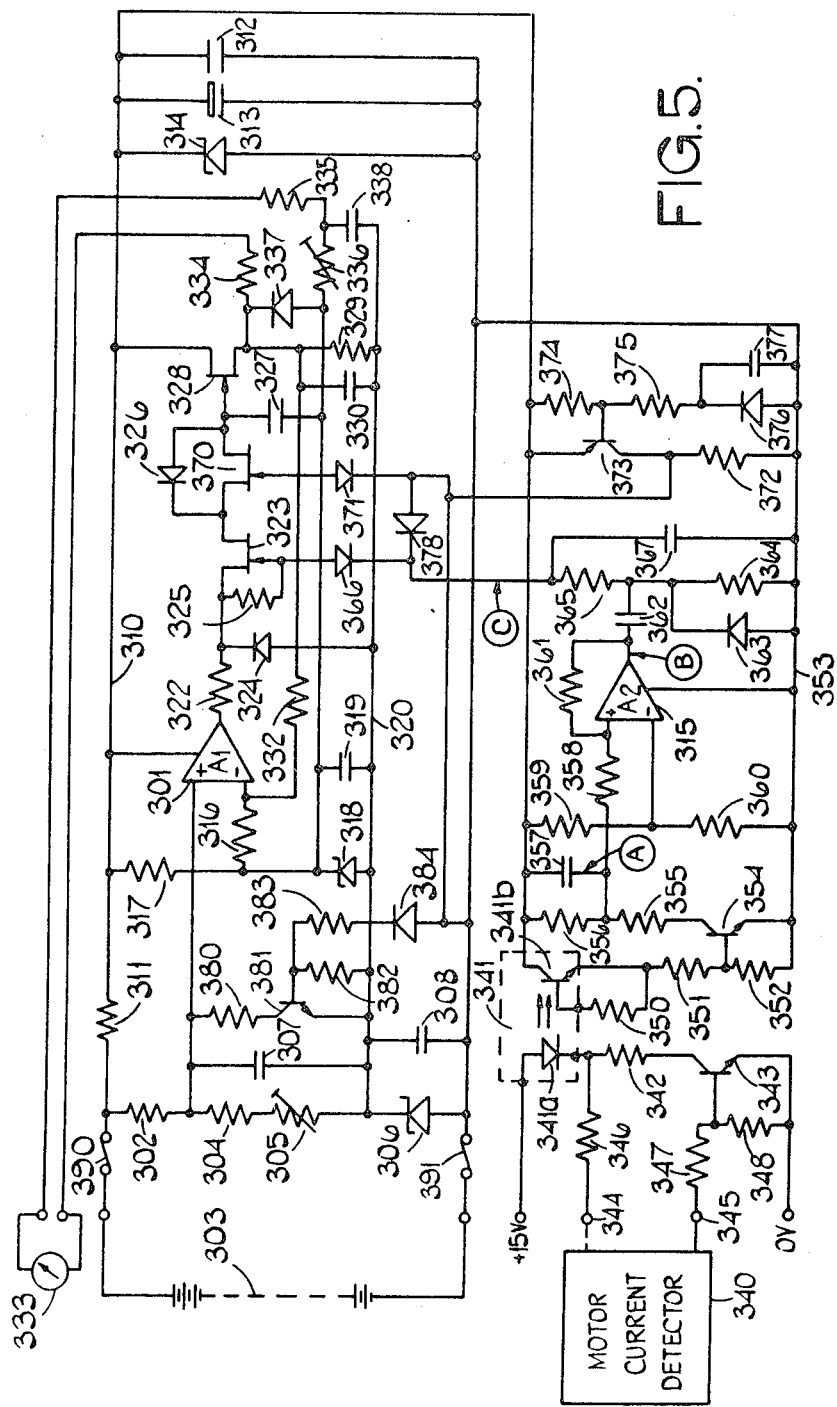
Figure 6:
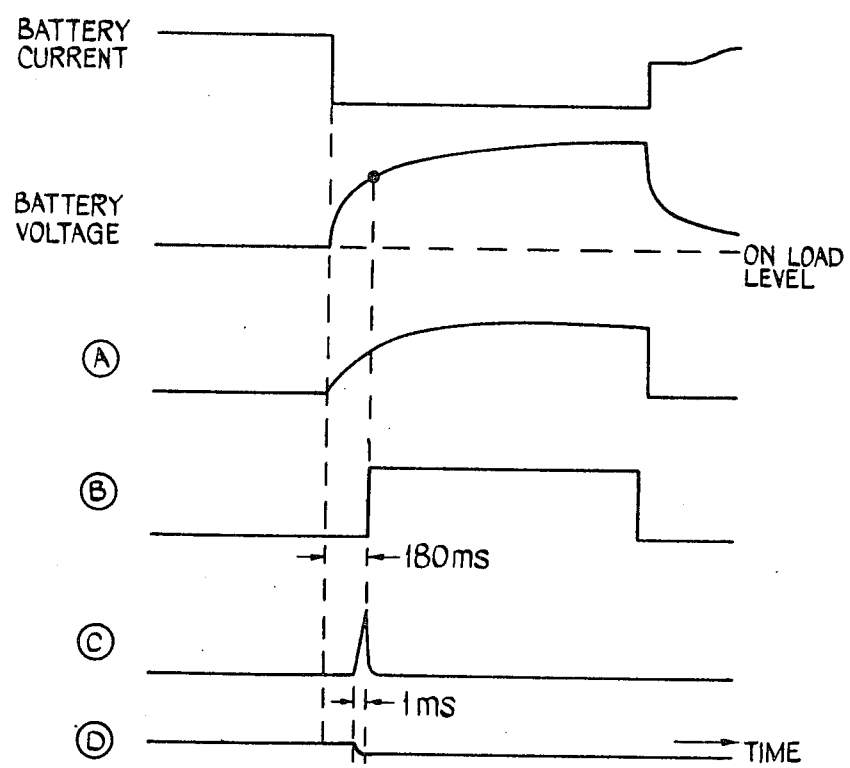

The present invention will now be described in more detail by way of example with reference to the accompanying drawings in which:

FIG. 1 is a block diagram of an electric vehicle system,

FIG. 2 is a circuit diagram of a battery state of charge device embodying the present invention for indicating the state of charge of the battery of the system shown in FIG. 1, FIG. 2a shows a modification of FIG. 2, FIG. 3 shows another modification of the circuit of FIG. 2, FIG. 4 is a circuit diagram of the electrical system of an invalid wheel chair powered by an electric battery, the system including a state of charge device for indicating the state of charge of the battery, FIG. 5 is a circuit diagram like FIG. 2 but showing a further example of the invention, and FIG. 6 is a graph showing waveforms at various points in FIG. 5.

Referring now to FIG. 1, the electric vehicle system there shown comprises a 216 volt traction battery 10 connected to a 216 volt positive supply rail 12 and an earth supply rail 14 through main contacts 16. The supply rails 12 and 14 are connected to an electric traction motor 17 through forward, reverse and brake selection contacts indicated at 18 and a thyristor chopper circuit 20. The contacts 18 connect the battery 10 to the motor 17 selectively for forward or reverse drive, during which power is supplied to the motor 17 from the battery 10, and also for braking which may be recuperative, i.e. power may be supplied from the motor 17 to the battery 10. The thyristor chopper 20 regulates current flowing through the armature of the motor 17 so that it has a desired mean value. The contacts 18 and chopper 20 are controlled by an electrical control circuit 22, to be described hereinafter.

The rails 12 and 14 are also connected to a DC to DC converter 24 which supplies power to a 12 volt positive supply rail 26 and an earth rail 28. A 12 volt battery 30, the lights, wipers and other standard electrical components, indicated at 32, and the control circuit 22 are connected in parallel across the rails 26, and 28. The control circuit 22 is provided with input signals from accelerator and brake pedals, indicated at 34 and 36 respectively, and from a forward/reverse lever, indicated at 38, and in accordance with the input signals the control circuit 22 produces an armature current demand signal to the thyristor chopper, through a line 40, and energizes brake, reverse and forward relay coils 42, 44 and 46, as appropriate which operate the brake, reverse and forward contacts, as indicated by dashed lines 48, 50 and 52.

A current transducer 51 is associated with the motor and produces an output corresponding to the current. This output is fed back to the chopper 20 to provide closed loop current control in known manner. The current transducer 51 output is also applied to a motor current detector circuit 53 which produces an interlock signal when the current is above a threshold value and applies this signal to the control circuit 22 to ensure that none of the coils 42, 44 and 46 can have its energisation state altered at a time when current in excess of the threshold is flowing in the associated contacts.

The system further comprises a charger 54, which may be connected to a normal mains 230 volt AC supply by terminals 56 and 58, and which may charge the battery 10 through lines 60 and 62. The charger 54 is provided with a 12 volt DC supply through lines 64 and 66 from lines 26 and 28 and produces a signal, for a purpose to be described hereinafter, at a terminal 68, the signal having a value of zero volts during charging and 12 volts at other times.

The electrical system is provided with two further terminals 70 and 72 connected to each end of the relay coil 46, for a purpose to be described hereinafter.

During operation, if the accelerator pedal 34 is depressed and the lever 38 is in the forward position, the control circuit 22 will energize the relay coil 46, thereby causing the forward contacts to be closed, and will supply a signal to the chopper 20 to regulate the current supplied to the motor 17 so that an average value is obtained, this value depending on the extent to which the accelerator pedal 34 is depressed. If, subsequently, the accelerator pedal 34 is released and the brake pedal 36 is depressed, the chopper 20 will block current from flowing through the line 14, the relay coil 46 will be de-energized and the brake coil 42 energized so that the brake contact is closed and the chopper 20 will then permit current to flow through the line 14, the mean value of this current depending upon the extent to which the brake pedal 36 is depressed, and power now flowing from the motor 17 to the battery 10 so that recuperative braking takes place. When the system actually changes from the forward drive state to recuperative braking, there has already been a short period, approximately 500 milliseconds, during which there is no current flowing between the battery 10 and the motor 17.

Referring now to FIG. 2, there is shown a battery state of charge indicator device, which uses the voltage of a battery as an indication of the state of charge, connected to the system of FIG. 1 for indicating the state of charge of the battery 10.

The state of charge device comprises a resistor 74 and a zener diode 76 connected in series between the rails 12 and 14, the junction of the resistor 74 and the zener diode 76 being connected to a 27 volt supply rail 78 and a capacitor 80 being connected across the zener diode 76. A resistor 82 and a zener diode 84 are series connected between the rails 78 and 14 and the junction of resistor 82 and the zener diode 84 is connected to a 6.2 volt reference rail 86. The rail 86 is connected to the inverting input terminal of an operational amplifier 88 through a variable resistor 90 and a further resistor 92. A resistor 94, a resistor 96 and a variable resistor 98 are series connected between rails 12 and 14 and the junction of resistors 94 and 96 is connected to the non-inverting input terminal of amplifier 98 thereby applying an attenuated battery voltage to this input. A resistor 100, a variable resistor 102, and a contact 104, operated by a relay coil 106, are connected in series across resistors 96 and 98 for a purpose to be described hereinafter. The output of amplifier 88 is connected through a feedback resistor 108 to the invert input. The supply terminals of the amplifier 88 are connected to rails 78 and 14 through lines 110 and 112.

Thus, the amplifier 88 compares the attenuated battery voltage with the voltage of the reference rail 86 and amplifies the difference between those two voltages, the output voltage of the amplifier 88 being equal to the amplified voltage plus the voltage of the reference rail 86.

The output of the amplifier 88 is connected through a resistor 114 to the source of a field effect transistor 116, which is connected as a switching element. The drain of f.e.t. 116 is connected to one terminal of a 3.3$\mu$ Farad storage capacitor 118, the other terminal of which is connected to the rail 86. Thus, when the f.e.t. 116 is conductive, the capacitor 118 is charged to a potential equal to the amplified voltage mentioned above.

The junction of f.e.t. 116 and capacitor 118 is connected to the gate of a further field effect transistor 120, connected as a source follower, the drain of which is connected to the rail 78 and the source of which is connected through an electric meter, indicated at 122, to the rail 86. The electric meter 122 thus detects the potential across capacitor 118 without loading this capacitor.

A guard ring 123 is included in known manner to prevent leakage of charge from the capacitor 118.

The electric meter 122 comprises a resistor 124 and an ammeter 126 connected in series and a zener diode 128 and a resistor 130 connected in series across the resistor 124. As will be described hereinafter, the deflection of the ammeter 126 indicates the state of charge of the battery 10. The zener diode 128 and resistor 130 are provided to compensate for the relatively rapid fall in battery voltage with progressive discharge which occurs at low state of charge, the zener diode 128 being arranged not to conduct at these states.

The rail 78 is further connected through a resistor 132 to the base of an n-p-n transistor 134, the collector of which is connected to the gate of the f.e.t. 116 and the emitter of which is connected to the rail 14. The junction of resistor 132 and transistor 134 is connected through a capacitor 136 and a resistor 138 to the rail 14 and the rail 78 is connected through a contact 140, operated by a relay coil 142, and a resistor 144 to the junction of capacitor 136 and resistor 138. A pair of terminals 146 are provided for shorting the contact 140 for testing purposes. The gate of the f.e.t. 116 is also connected to the output of amplifier 88 through a resistor 148, and a diode 150 is connected from the junction of resistor 114 with the f.e.t. 116 to rail 86.

When the relay coil 142 is energized and the contact 140 closed, the capacitor 136 charges while the transistor 134 remains conductive and hence the f.e.t. 116 remains non-conductive. If relay coil 142 is subsequently de-energized, contact 140 will open and the base of transistor 134 will be reverse biased by capacitor 136 for approximately 150 to 200 milliseconds. This will render the f.e.t. 116 conductive and hence capacitor 118 will be charged or discharged by amplifier 88.

The resistor 132, transistor 134, capacitor 136, resistor 138 and resistor 144 thus comprise a timing means and ensure that the f.e.t. 116 is rendered conductive for a predetermined period of time after contact 140 opens.

The diode 150 is included in the circuit to prevent the f.e.t. 116 from becoming conductive due to low voltage at the output of amplifier 88.

The base of transistor 134 is also connected through a contact 152 to the rail 14, the contact 152 being operated by relay coil 106, the contact 104 and 152 being closed when coil 106 is energized.

The relay coil 106 and a resistor 154 are connected in parallel across two terminals 156 and 158, the terminal 156 being connected to the terminal 70 of FIG. 1, and the terminal 158 being connected to the terminal 68. The relay coil 142 and a resistor 160 are connected in parallel across the terminal 156 and a terminal 162 connected to the terminal 72 of FIG. 1.

The operation of the battery state of charge indicating device will now be described with reference to the electrical system of FIG. 1.

If the control circuit 22 is in the forward drive condition, the relay coil 46 will be energized and the forward drive contact 18 closed, thereby connecting the battery 10 to the motor 17. The relay coil 142 will thus be energized and the contact 140 closed. The transistor 134 will, therefore, be on and so that f.e.t. 116 will be non-conductive. If the control circuit 22 now changes to braking condition, the relay coil 46 will first be energized thereby de-energizing the relay coil 142 and opening contact 140. The transistor 134 will now be reverse biased for 150 to 200 milliseconds thereby rendering the f.e.t. 116 conductive and the capacitor 118 will be charged to the potential of the output of the amplifier 88. When the f.e.t. 116 subsequently becomes non-conductive again, this potential will be stored in the capacitor 118 and the reading on the ammeter 126 will be determined by this potential.

As explained above, the brake contacts are closed approximately 500 milliseconds after the forward drive contacts have been opened, and so the reading on the ammeter 126 is determined by the potential of the battery 10 when no current is flowing between the battery 10 and the meter 16. Thus, the reading will not be affected by the internal resistance of the battery 10.

As the internal resistance of a battery changes with state of charge, current drawn, temperature and age of the battery, the device of the present invention provides an important advantage over state of charge devices which measure the state of charge when current is flowing.

In fact, the battery 10 will usually be supplying a small amount of current, typically one amp, to the DC to DC converter 24 the whole time, but this current is small compared with the motor current, typically 100–400 amps, and so will not have an appreciable effect on the reading of the ammeter 126.

Also, for a particular state of charge when a battery is being discharged, the potential of the battery falls with time to a lower level due to polarization or chemical changes occuring in the battery. Likewise, during charging, the potential rises with time to a higher level, also due to polarization. After discharge, the potential rises with time to a higher level, and after charging falls to a lower level, until the battery has recovered from polarization. This recovery may continue for a period in excess of one hour. Thus, for a given state of charge and at zero current, there will be a difference in value between the battery voltage after charging and after discharging and also the voltage will vary with time after charging or after discharging. In the device of the present invention, by rendering the transistor 116 conductive only after the vehicle has been in forward drive and only rendering the transistor 116 conductive for a predetermined time, in the example 150–200 milliseconds, the reading on the ammeter 126 will be independent of the above mentioned difference and variation.

Thus, the ammeter 126 provides a very good indication of the state of charge of the battery 10 and the reading will be up-dated each time the control circuit changes from the forward drive condition to the recuperative braking condition.

The ammeter 126 provides a continuously variable indication of the state of charge of the battery 10 and the provision of the capacitor 118 ensures that the ammeter provides an indication of the state of charge even when the f.e.t. 116 is rendered non-conductive. Thus, the device of the present invention provides an indication of the state of charge in a manner analogous to the fuel gauge in a conventional internal combustion engine.

The zero reading on the ammeter 126, corresponding to zero charge, may be set by the variable resistor 98, and the full scale deflection of the ammeter 126, corresponding to full charge, may be set by the variable resistor 90.

The state of charge indicating device may also be used to indicate the state of charge of the battery during charging of the battery 10 by the charger 54. When the battery 10 is being charged, the relay coil 106 will be energized and the contacts 104 and 152 closed. The contact 152 will connect the base of transistor 134 to rail 14, thereby turning off transistor 134 and rendering the f.e.t. 116 conductive so that the ammeter 126 continuously monitors the output of the amplifier 88. The contact 104 connects the junction of resistors 94 and 96 to the rail 14 through resistors 100 and 102 thereby altering the attenuation factor of the battery voltage presented to the non-invert input of amplifier 88 and thereby compensating for the higher potential which exists during charging for a particular state of charge. The extent of this compensation may be adjusted by variable resistor 102. The current which is supplied by the charger 54 is small and its value is taken into account when setting the resistor 102 and calibrating the ammeter 126.

In the modification shown FIG. 2a, a resistor R and a capacitor C in series are connected across the resistor 94. These components compensate for the magnitude and duration of current flowing out of the battery immediately prior to sampling.

Referring now to FIG. 3, there is shown a circuit generally similar to FIG. 2, and like parts have been denoted by the same reference numerals, but which includes a modification to the circuit of FIG. 2 to compensate for a false high reading which can occur when the electric vehicle system changes from braking to forward drive and back to braking within a short time. When this happens, the battery voltage may be high for a particular state of charge when the system changes from forward drive to braking owing to the charging which has taken place during the preceding braking and in the circuit of FIG. 2 this could result in a high reading on the ammeter 126. In FIG. 3, the resistor 114 of FIG. 2 has been replaced by an 82k ohm resistor 164 and a diode 166 connected in series between the output of amplifier 88 and the source of the f.e.t. 116 and a 22k ohm resistor 168 and a diode 170 also connected in series between the output of amplifier 88 and the source of the f.e.t. 116, the cathode of diode 166 and the anode of diode 170 being connected at the source of the f.e.t. 116. In this circuit, when the battery 10 is being used to power the vehicle, the battery 10 will be discharging and consequently each time the relay coil 46 is de-energized the 3.3μ Farad capacitor 118 will discharge slightly through the f.e.t. 116, diode 170 and resistor 168. However, if the control circuit changes from braking to forward drive and back to braking as described above, the effect of the increased voltage of the battery due to recuperative charging will be reduced as this high voltage would have to overcome the forward voltage drop on diode 166 and also the relatively high resistance of resistor 164 in order to charge the capacitor 118.

In another embodiment of the invention, not shown, the false high reading is prevented by only rendering the f.e.t. 116 conductive if the system has previously been in the forward drive state for a predetermined period, for example ten seconds, which is long enough to compensate for a high voltage which may have been caused by charging during previous recuperative braking.

If it is desired to isolate the ammeter 126 from the battery 10, this may be achieved by using an opto-isolator comprising an opto-isolator pair, an operational amplifier and three resistors.

Referring now to FIG. 4, there is shown a circuit diagram of the electrical system of an invalid wheel chair which includes a state of charge indicator device. The system comprises a 24 volt battery 180 connected to a positive supply line 184 through a main switch 182 and to a negative supply line 186. A motor 188 for driving a left-hand wheel of the chair and a thyristor chopper circuit 190 are connected in series between lines 184 and 186 and a motor 192 for driving a right-hand wheel of the chair and a thyristor chopper circuit 194 are likewise connected in series between the lines 184 and 186.

A timing means comprising a 100k ohm resistor 196 and a 47μ Farad capacitor 198 are connected in series between lines 184 and 186. The common point of resistor 196 and capacitor 198 is connected to a junction point 200 through a 100k ohm resistor 202, to the invert input of an operational amplifier 204 and to the non-invert input of an operational amplifier 205. The junction point 200 is connected through a diode 206 to the common point of motor 188 and chopper 190 and also through a diode 208 to the common point of motor 192 and chopper 194. An 8k ohm resistor 210, a 6k ohm resistor 212 and a 10k ohm resistor 214 are connected in series between lines 184 and 186, the common point of resistors 210 and 212 being connected to the non-invert input of amplifier 204, thereby setting this input at approximately 16 volts, and the common point of resistors 212 and 214 is connected to the invert input of the operational amplifier 205, thereby setting this input at approximately 10 volts.

The output of amplifier 204 is connected to line 186 through a diode 216, a resistor 218 and a resistor 220, and the common point of diode 216 and resistor 218 is connected to the output of the amplifier 205 through a resistor 222. The common point of resistors 218 and 220 is connected to the base of an n-p-n transistor 224, the emitter of which is connected to line 186 and the collector of which is connected to a line 226.

A resistor 228 and a 6.2 volt zener diode 230 are connected in series between lines 184 and 226, the common point of resistor 228 and zener diode 230 being connected to the non-invert inputs of operational amplifiers 232 and 234. A resistor 236, a resistor 238, a resistor 240 and a variable resistor 242 are also connected between lines 184 and 226, the common point of resistors 236 and 238 being connected to the invert input of amplifier 232 and the common point of resistors 238 and 240 being connected to the invert input of amplifier 234.

A green lamp 244, an amber lamp 246 and a red lamp 248 are also connected in series between lines 184 and 226, the common point of lamps 244 and 246 being connected to the output of amplifier 234 through a resistor 250, and the common point of lamps 246 and 248 being connected to the output of amplifier 232 through a resistor 252.

The amplifiers 204 and 205 are provided with power from lines 184 and 186 and the amplifier 232 and 234 are provided with power from lines 184 and 226, through lines not shown.

The amplifiers 204, 205, 232 and 234 are arranged so that the output assumes a value of 24 volts if the voltage at the non-invert terminal is greater than the voltage at the invert terminal and a value of zero volts if the voltage at the invert terminal is greater than the voltage at the non-invert terminal.

The operation of the circuit will now be described.

If either of the choppers 190 and 194 is operating, the capacitor 198 will be kept discharged by current flowing through resistor 202 and diode 206 or 208 when the chopper is ON. The output of amplifier 204 will, therefore, be at 24 volts and the output of amplifier 205 will be at zero volts, with the result that transistor 224 will be non-conductive and so none of the lamps 244, 246 and 248 will be illuminated.

As soon as both choppers have stopped operating, capacitor 198 will charge through resistor 196. After approximately three seconds, the potential across capacitor 198 will reach 10 volts and the amplifier 205 will rise to 24 volts with the result that transistor 224 will be rendered conductive. When this happens, the amplifier 232 and 234 will compare the voltage drop across zener diode 230 with the battery voltage. If the battery voltage is high, the output voltages of amplifiers 232 and 234 will both be zero volts and the green lamp 244 will be illuminated thereby indicating a high level of charge, for example above 50%. If the battery voltage is medium, the output voltages of amplifiers 232 and 234 will be zero volts and 24 volts respectively, and the amber lamp 246 will be illuminated thereby indicating a medium level of charge, for example 25–50%. If the battery voltage is low, the output of both amplifiers 232 and 234 will be 24 volts and the red lamp 248 will be illuminated thereby indicating a low level of charge, for example less than 25%.

After a further three seconds, the potential across capacitor 198 will reach 16 volts, the output of amplifier 204 will fall to zero volts, the transistor 220 will be rendered non-conductive and the illuminated lamp will be extinguished.

Thus, as the transistor 224 is only rendered conductive when neither motor 188 nor 192 is being driven, the comparison made by amplifiers 232 and 234 will be independent of the internal resistance of the battery 180, and as the comparison is made for a predetermined time very shortly after the choppers have ceased to operate, the comparison is independent of the rise in battery voltage which occurs after discharge.

Further, the three second delay prevents the comparison being made during a temporary interruption in the operation of the choppers 190 and 194 caused, for example, by indecision by the driver of the wheel chair.

Referring now to FIG. 5 the device shown therein includes an operational amplifier 301 which has its non-inverting input terminal connected by a resistor 302 to the positive terminal of a battery 303 to be monitored. This non-inverting terminal of operational amplifier 301 is also connected by a resistor 304 and a variable resistor 305 in series to the cathode of a zener diode 306, the anode of which is connected to the negative terminal of the battery 303. A capacitor 307 connects the non-inverting terminal of operational amplifier 301 to the cathode of zener diode 306 and a further capacitor 308 is connected in parallel with zener diode 306.

The power supply for the operational amplifier 301 is derived from a rail 310 which is connected to the positive terminal of the battery 303 by a resistor 311 and a fuse 390 and which is connected to the negative terminal of the battery by the parallel combination of two capacitors 312, 313 and a zener diode 314. In fact the operational amplifier 301 is one of a pair contained in a single integrated circuit package and, in drawing, the other operational amplifier 315 is shown as having a supply connection to the negative battery terminal via another fuse 391.

The inverting input terminal of amplifier 301 is connected by a resistor 316 to the cathode of a zener diode 318, the anode of which is connected to a rail 320 connected to the cathode of the zener diode 306. A capacitor 319 is connected across the zener diode 318 and a resistor 317 connects the cathode of a zener diode 318 to the rail 310.

The output terminal of the amplifier 301 is connected by a resistor 322 to the source of an f.e.t. 323, a diode 324 having its cathode connected to such source and its anode connected to the rail 320. A resistor 325 is connected between the source and gate of the f.e.t. 323 and the drain of the f.e.t. 323 is connected to the cathode of a diode 326, the anode of which is connected by a capacitor 327 to the cathode of the zener diode 318. This capacitor 327 constitutes a signal storage device which acts to store a signal corresponding to the battery voltage at the time when the f.e.t. 323 was last conductive. The diode 326 ensures that the signal stored on capacitor 327 can only be reduced each time the f.e.t. 323 is made conductive.

The anode of diode 326 is also connected to the gate of an f.e.t. 328, the drain of which is connected to rail 310 and the source of which is connected by a resistor 329 and a capacitor 330 in parallel to the rail 320. A resistor 332 connects the drain of the f.e.t. 328 to the inverting input terminal of the amplifier 310 to provide feedback in known manner.

A meter movement 333 has one terminal connected by a resistor 334 to the source of the f.e.t. 328 and its other terminal connected by a resistor 335 and a variable resistor 336 in series to the cathode of the zener diode 318. A capacitor 338 connects the junction of resistors 335, 336 to the rail 320. A diode 337 has its cathode connected to source of f.e.t. 328 and its anode connected to the cathode of the zener diode 318. The meter 333 indicates the voltage signal for the time being stored on the capacitor 327, the f.e.t. 328 acting as a source follower to ensure that capacitor 327 is discharged at only a very slow rate.

The conduction of the f.e.t. 323 is controlled to ensure that it conducts only for a short period at a precisely determined instant following cessation of motor current. To this end an output is taken from a circuit 340 which is a part of the motor control circuit and produces a signal according to whether the motor current is above or below a predetermined threshold. This circuit is used principally in the motor control circuit to ensure that various contactors which determine the motor operational mode may open safely. To interface with circuit 340, which is driven from a separate supply isolated from the main battery 303, an opto-isolator 341 is used. The light-emitting diode 341*a* of this isolator 341 has its anode connected to a +15v supply rail of said separate supply and its cathode connected by a resistor 342 and the collector-emitter of an npn transistor 343 to the earth terminal of the separate supply. The interface circuit has two input terminals 344 and 345. Terminal 344 is connected by a resistor 346 to the cathode of the light-emitting diode 341*a* and is used when the detector circuit 340 is such that its output goes low (and can sink the light-emitting diode current) when the motor current is above the threshold level. The other terminal 345 is connected by a resistor 347 to the base of transistor 343, a further resistor 348 being connected between the base and emitter of this transistor, and is used when the detector circuit 340 is such that its output is low when the motor current is below the threshold. In either case, when the motor current is above the threshold the light-emitting diode 341*a* conducts and thereby renders the associated photo-transistor 341*b* conductive.

The photo transistor 341*b* has its base connected by a resistor 350 to its emitter, which is connected by two resistors 351, 352 in series to a rail 353 connected to the negative terminal of the main battery 303. The collector of photo transistor 341*b* is connected to the rail 310. An npn transistor 354 has its emitter connected to rail 353, its base connected to the junction of resistors 351 and 352 and its collector connected by two resistors 355 and 356 in series to the rail 310. A capacitor 357 is connected across the resistor 356. The junction of resistors 355 and 356 is connected by a resistor 358 to the non-inverting input terminal of the amplifier 315. Two resistors 359 and 360 connected in series between the rails 310 and 353 have their junction connected to the inverting input. A resistor 361 connects the output terminal of amplifier 315 to its non-inverting input terminal so that amplifier 315 acts as a Schmidt trigger circuit.

The output terminal of amplifier 315 is connected by a capacitor 362 to the cathode of a diode 363 having its anode connected to the rail 353. A resistor 364 is connected in parallel with the diode 363. The cathode of diode 363 is connected by a resistor 365 to the cathode of a diode 366 which has its anode connected to the gate of the f.e.t. 323. A capacitor 367 connects the cathode of diode 366 to the rail 353.

Referring now to FIG. 6, operation of the circuit which controls conduction of the f.e.t. 323 will now be explained. Whilst the motor current is in excess of the threshold level transistor 354 will be conductive, thereby holding the voltage at point A (FIG. 5) low. When motor current ceases transistor 354 turns off, but capacitor 357 causes the voltage at point A to rise relatively slowly so that it takes about 180 mS for the voltage at A to rise sufficiently high to trigger the amplifier 315. Such triggering causes the output of amplifier 315 to go high. Capacitor 362 then passes a positive-going pulse lasting about 0.8 to 1 mS which renders the f.e.t. 323 conductive. The 180 mS delay allows the battery voltage to recover sufficiently to represent its state of charge, bearing in mind that if sampling starts too soon a falsely low reading will be obtained.

Since the diode 326 prevents the voltage on capacitor 327 being increased when f.e.t. 323 conducts, a circuit is included to enable an initial charge to be introduced onto capacitor 327 each time the circuit is switched on. To this end there is a further f.e.t. 370 having its source connected to the cathode of the diode 326 and its drain connected to the anode of diode 326. The gate of the f.e.t. 370 is connected to the anode of a diode 371, the cathode of which is connected by a resistor 372 to the rail 353. A pnp transistor 373 has its emitter connected to the rail 310 and its collector connected to the cathode of the diode 371. The base of transistor 373 is connected by a resistor 374 to the rail 310 and by a resistor 375 to the cathode of a diode 376 the anode of which is connected to the rail 353. A capacitor 377 is connected across the diode 376. A further diode 378 has its anode connected to the cathode of the diode 371 and its cathode connected to the cathode of the diode 366, to prevent the f.e.t. 370 being turned on by the pulses passed by capacitor 362.

At switch-on current flows through resistors 374 and 375 to charge up capacitor 377. During such charging, transistor 373 turns on and thus passes current through resistor 372 and through diode 378 and resistors 365 and 364 in series. Thus both f.e.t.s 323 and 370 are conductive for as long as transistor 373 is turned on (which is for about 200 mS). This enables the capacitor 327 to charge up to a voltage representative of the battery voltage.

Since it is the battery voltage sampled following a discharge current which is taken to be representative of the battery state of charge, the initial voltage introduced on to capacitor 327 as described above will not be representative of the battery state of charge if switch-on occurs following an extended period of non-use of the battery. This is because, during discharge and immediately following discharge, there is a polarisation potential on the battery which effectively reduces the terminal voltage, but which decays to near zero in about one minute. Thus the meter reading following initial charging of capacitor 327 could be excessively high to indicate the battery state of charge accurately at switch-on.

To overcome this inaccuracy, a resistor 380 is connected between the non-inverting input terminal of the amplifier 301 and the collector of an npn transistor 381. The emitter of transistor 381 is connected to the rail 320 and its base is connected, via a resistor 382 to this rail. The base of transistor 381 is also connected by a resistor 383 to the cathode of a diode 384, the anode of which is connected to the collector of the transistor 373.

Transistor 381 turns on whenever transistor 373 is on (i.e. during the first 200 mS following switch-on) and puts resistor 380 in parallel with the series combination of resistor 304 and variable resistor 305, thereby attenuating the input to the operational amplifier 301 for this period.

It will be noted that sampling occurs whenever motor current falls below the threshold level for more than 180 mS, both following discharge of the battery by motor current or charging by recuperative braking action. However, during recuperative braking the battery voltage rises and the diode 326 thus blocks the passage of the increased voltage signal to the capacitor 327. The circuit described above is therefore equally applicable to motor controls with or without provision for recuperative braking.

It is considered that leakage of current from the capacitor via the gate of f.e.t. 328 will be at least partially compensated for by leakage of current through the f.e.t.s 323, 370 and diode 326. A storage time of over an hour can be achieved.

The capacitor 367 decouples the point C (FIG. 5) from any noise in that vicinity and the capacitors 330 and 338 in conjunction with resistors 334 and 335 act to protect the source-gate junction of f.e.t. 328 from negative-going noise spikes which may cause discharge of capacitor 327.

The diode 306 provides a sufficient voltage on rail 320 to ensure that there is enough negative bias available in all circuit conditions to turn off f.e.t.s 323 and 370 completely (except when turn on is required).

The variable resistors 305 and 336 are used to set-up the circuit to give zero and full scale readings on the meter for the appropriate battery voltages.

Instead of using an output from the motor current detector 340 of the motor control circuit some other control signal could be employed, for example a signal derived from a switch on the vehicle accelerator pedal (if recuperative braking is not employed).

In the example described above it will be noted that sampling of the battery voltage is initiated when the motor current is less than a threshold value. When the chopper controlling the electric motor is switched off, battery current ceases immediately even though recirculating current flows through the motor and a recirculating diode for a time. Sampling occurs if the motor current falls below the threshold (say 30 amps) and remains below that value of 180 mS. The actual time for which no current has been flowing from the battery exceeds this 180 mS, however, because of the recirculating current decay period.

I claim:

1. An electric vehicle including an electric storage battery; an electric traction motor mechanically connected to at least one ground wheel of the vehicle; motor current control means electrically connecting the motor to the battery, said control means including driver operable means and motor current sensing means and operating to control the supply of current to the motor in accordance with the setting of the driver operable means; and a battery state-of-charge monitoring means comprising a battery voltage sensing circuit connected to the battery and providing an output signal representing the battery voltage, a signal storage device, a switch device connecting the output of the voltage sensing means to the signal storage device, said switch device having a control input at which a predetermined signal causes the output of the voltage sensing means to be applied to the signal storage device, a unidirectional current flow device in series with said switch device connected to prevent the signal stored on the signal storage device being increased in normal operation, triggering means connected to the current sensing means and operating when the output of the current sensing means indicates that the motor current falls below a predetermined level, timing means connected to said triggering means and to said control input of the switching device and operating so as to render the switching device conductive briefly after a predetermined delay following each operation of the triggering means, and indicating means connected to the signal storage device and providing a continuous indication of the signal stored on said storage device.

2. An electric vehicle as claimed in claim 1 further comprising means for introducing an initial signal on to said signal storage device which is representative of the battery voltage at switch-on.

3. An electric vehicle as claimed in claim 2 in which said signal introducing means includes a further switch device connected in parallel with said unidirectional current flow device and a further timer circuit connected to said switch device and said further switch device and arranged to render both switch devices conductive for a predetermined period at switch-on only.

4. An electric vehicle as claimed in claim 3 further comprising an attenuation circuit controlled by said further timer means and effectively reducing the input to the voltage sensing means for the duration of said predetermined period at switch-on.

5. An electric vehicle as claimed in any one of claims 1 to 4 inclusive in which the indicating means includes a buffer device connected to the storage device and a current meter which is connected to the buffer device for the supply of current thereby.

* * * * *